(12) United States Patent
Heston et al.

(10) Patent No.: US 7,755,222 B2
(45) Date of Patent: Jul. 13, 2010

(54) METHOD AND SYSTEM FOR HIGH POWER SWITCHING

(75) Inventors: David D. Heston, Dallas, TX (US); Jon E. Mooney, Dallas, TX (US)

(73) Assignee: Raytheon Company, Waltham, MA (US)

( * ) Notice: Subject to any disclaimer, the term of this patent is extended or adjusted under 35 U.S.C. 154(b) by 701 days.

(21) Appl. No.: 11/328,034

(22) Filed: Jan. 9, 2006

(65) Prior Publication Data

US 2007/0159230 A1    Jul. 12, 2007

(51) Int. Cl.
*H01H 47/00* (2006.01)
(52) U.S. Cl. .................................. 307/128; 307/130
(58) Field of Classification Search ............... 307/130, 307/128
See application file for complete search history.

(56) References Cited

U.S. PATENT DOCUMENTS

| | | | |
|---|---|---|---|
| 6,853,235 B2* | 2/2005 | Nakayama et al. | 327/379 |
| 6,987,414 B2* | 1/2006 | Numata | 327/365 |
| 7,023,258 B2* | 4/2006 | Hamase | 327/308 |
| 7,106,121 B2* | 9/2006 | Hidaka et al. | 327/308 |
| 7,199,635 B2* | 4/2007 | Nakatsuka et al. | 327/308 |
| 2005/0179506 A1* | 8/2005 | Takahashi et al. | 333/104 |

OTHER PUBLICATIONS

Numata, et al., "*A High-Power-Handling GSM Switch IC with New Adaptive-Control-Voltage-Generator Scheme*," RFIC Symposium, pp. 233-236, 2003.
Notification of Transmittal of the International Search Report and the Written Opinion of the International Searching Authority, or the Declaration, Jul. 4, 2007; International application No. PCT/US2007/000572; International filing date Jan. 9, 2007; 11 pages.

* cited by examiner

*Primary Examiner*—Jared J Fureman
*Assistant Examiner*—Hal I Kaplan
(74) *Attorney, Agent, or Firm*—Baker Botts L.L.P.

(57) ABSTRACT

According to one embodiment of the invention a method for switching an alternating current signal between at least two paths includes providing, in at least one of the paths, first and second field effect transistors in series. The method also includes providing a control voltage node operable to receive a control voltage and maintaining each of the first and second field effect transistors in pinch-off mode by offsetting a voltage on each gate of the field effect transistors with a DC voltage component other than the control voltage when it is desired for the alternating current not to flow through the at least one path.

15 Claims, 3 Drawing Sheets

METHOD AND SYSTEM FOR HIGH POWER SWITCHING

TECHNICAL FIELD OF THE INVENTION

This invention relates generally to signal processing and more particularly to a method and system for high power switching.

BACKGROUND OF THE INVENTION

In terms of power handling a switch field effect transistor (FET) is limited in its high impedance "off" state by the gate bias voltage used to control the device. In the high impedance state, the switch FET is typically connected to an amplifier which is also biased off and has the effect of placing the switch FET in a shunt configuration with the source terminated in a short. As with most switch FETs, the gate terminal is terminated with an RF "open." Thus, approximately half the RF voltage on the drain appears on the gate and is superposed on the gate bias voltage. The RF voltage swing on the switch FET turns the FET "on" for a portion of the RF cycle thereby reducing power handling if one of the following conditions occurs: (1) the RF voltage swing on the gate exceeds the pinch-off voltage of the device, or ((2) the difference between the instantaneous drain-to-gate voltage exceeds the breakdown voltage of the device.) In mobile phones where battery power supplies are typically around three volts, the first condition often occurs before the second.

Prior solutions for handling switch FETs in the off state involve stacking switch FETs in series. This solution essentially divides the RF voltage across a number of switch FETs, which keeps the gate-to-source and gate-to-drain voltages within the ranges necessary to obtain the "off" condition. A problem with this approach is that a large number of stacked switch FETs in series creates a large circuit size and therefore is costly. It also increases the insertion loss of the switch.

SUMMARY OF THE INVENTION

According to one embodiment of the invention a method for switching an alternating current signal between at least two paths includes providing, in at least one of the paths, first and second field effect transistors in series. The method also includes providing a control voltage node operable to receive a control voltage and maintaining each of the first and second field effect transistors in pinch-off mode by offsetting a voltage on each gate of the field effect transistors with a DC voltage component other than the control voltage when it is desired for the alternating current not to flow through at least one path.

Embodiments of the invention may provide numerous technical advantages. Some, none, or all embodiments may benefit from the below-described advantages. According to one embodiment of the invention, a DC restoring circuit allows for switching of alternating current signals at high power levels through a small device with large absorption of RF energy and good insertion loss.

Another advantage will be readily apparent to those of skill in the art.

BRIEF DESCRIPTION OF THE DRAWINGS

A more complete understanding of embodiments of the invention will be apparent from the detailed description taken in conjunction with the accompanying drawings in which.

DETAILED DESCRIPTION OF THE INVENTION

Example embodiments of the present invention and their advantages are best understood by referring to FIGS. 1 through 3B of the drawings, like numerals being used for like and corresponding parts of the various drawings.

Figure 1:
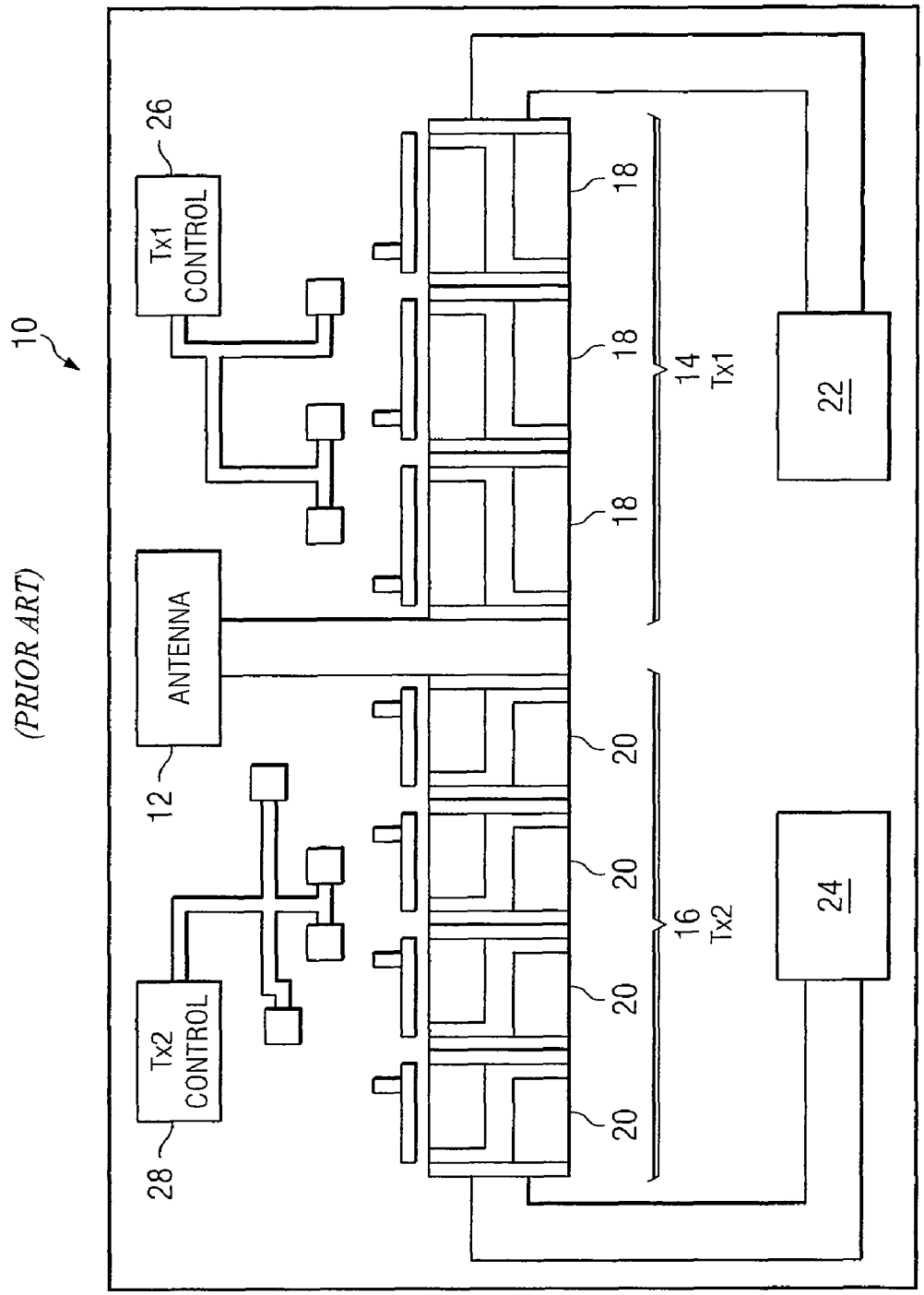
FIG. 1 is a schematic diagram illustrating a conventional high power switch.

FIG. 1 is a schematic diagram illustrating a conventional high power switch 10. Switch 10 includes an antenna node 12, a first leg 14, a second leg 16, and output nodes 22 and 24. First leg 14 comprises a plurality of field effect transistors (FETs) 18 stacked in series. Second leg 16 includes a plurality of FETs 20 stacked in series.

In operation, a radio frequency, or alternating current, signal is received by antenna 12 and switched to output 22 or output 24. This switching is effected by either all FETs 18 or all FETs 20 in respective paths 14 and 16 turning on or off together. In some implementations, such as cellular phones, a control voltage for FETs 18 or 20, which may be applied at nodes 26 and 28 respectively, is conventionally −3 volts or −5 volts. The switch may also work where transmit amplifiers at nodes 22 and 24 transmit high power signals through the switch and out antenna node 12. The switch is used to select which transmit signal is being transmitted.

Because of the large magnitude of the signal received or transmitted at antenna 12, the voltage swing resulting across the gates of FETs 18 or 20 when biased off may exceed the pinch-off voltage for the FETs. Generally, FETs 18 and 20 are maintained in pinch-off mode by the control voltage when it is desired that RF signal not flow through their associated path and are taken out of pinch-out mode when it is desired for RF signal to flow through their respective paths. However, if the voltage swing at node 12 is too large, the resulting voltage on the associated gates of FETs 18 and 20 when biased off may result in bringing the FETs out of pinch-off mode when that is not desired.

Switch 10 illustrates a conventional approach to addressing this problem by stacking FETs in series such that the swing across the gate of any given FET 18 or 20 when biased off is not great enough so as to bring it out of pinch-off mode at an undesired time. A problem with this approach, however, is that it creates an unnecessarily large device, increasing its cost.

According to the teachings of the invention, a DC restoring circuit is utilized in a switch that offsets a DC component of the voltage on the gates of the switch FETs, forming a part of a switch, such that the voltage swing on the gates does not bring the FETs out of pinch-off mode at undesired times. Example details are described in greater detail below in conjunction with FIGS. 2 through 3B.

Figure 2:
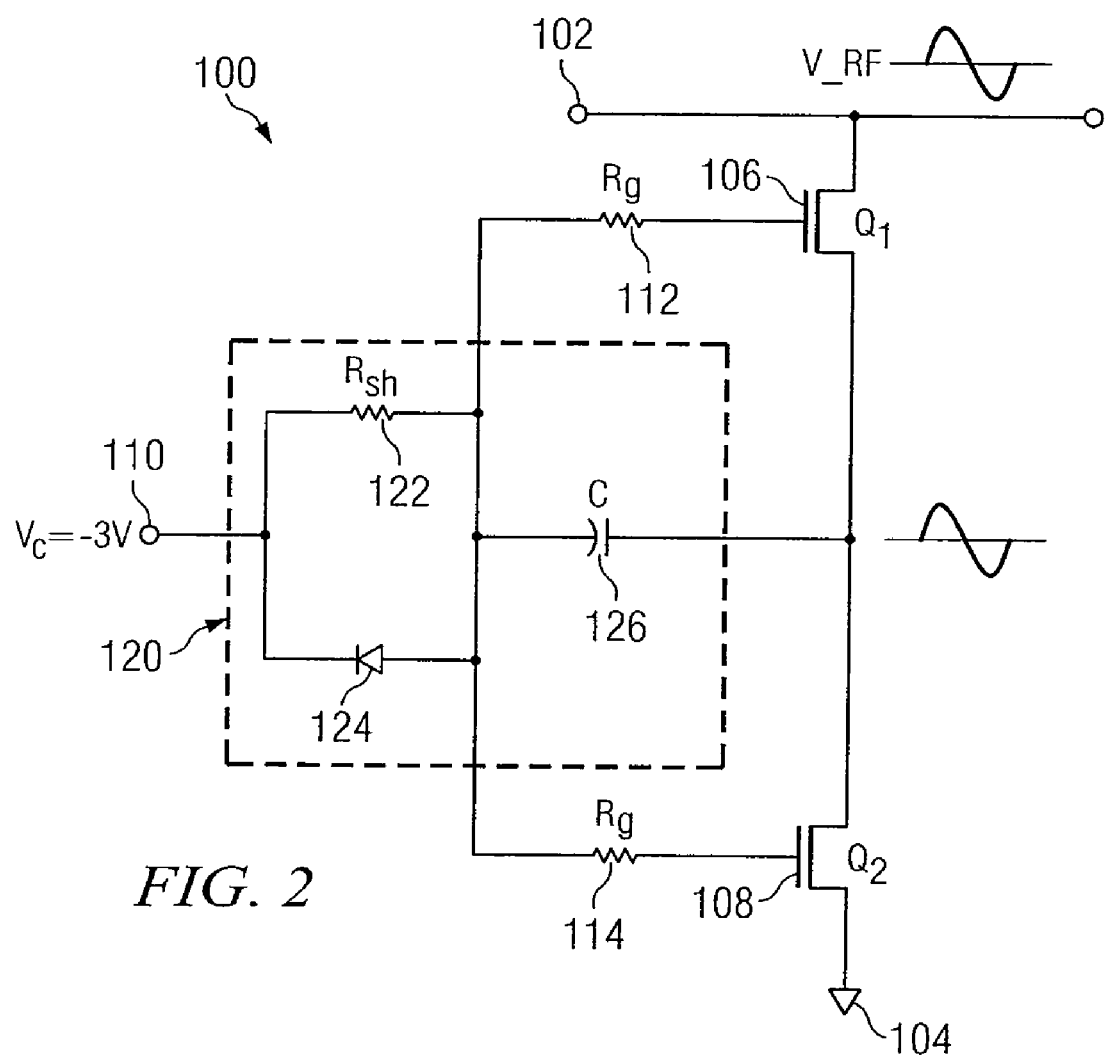
FIG. 2 is a circuit diagram illustrating a portion of a leg of a switch according to the teachings of the invention.

FIG. 2 is a circuit diagram illustrating a portion 100 of a switch according to the teachings of the invention. In this example, portion 100 may represent the path 14 of FIG. 1, except for the differences described below. FIG. 2 also illustrates an input node 102 for receiving or transmitting an RF signal. As used herein, RF signals refer to alternating current signals of any frequency including microwave frequencies as well as lower and higher frequencies. Path 100 includes a reference node 104, which may be a ground node or may be connected to another pair of FETs and another associated DC restoring circuit, as described in greater detail below.

Path 100 includes a pair of switch FETs 106 and 108 connected in series. FET 106 has its drain connected to input node 102 and its source connected to the drain of FET 108. FET 108 has its source connected to reference node 104. Although a particular configuration of FETs has been illustrated, other suitable configurations may be utilized. Associated with FETs 106 and 108 is a control voltage node 110 for receiving a control voltage. In a cell phone applications, this control voltage may be −3 or −5 volts; however, other suitable control voltages may be utilized. A control voltage applied at node 110 places FETs 106 and 108 into pinch-off mode, such that no current may flow through path 100, turning off this leg of the switch.

A gate resistor 112 is associated with the gate of FET 106, and a gate resistor 114 is associated with the gate of FET 108. Gate resistors 112 and 114 are typically large, providing isolation for DC restoring circuit 120 from an RF signal applied at node 102. Example resistance may be 2 to 3 kiloohms; however, other suitable resistance values may be utilized.

Path 100 also includes a DC restoring circuit 120. DC restoring circuit 120 operates to provide a DC offset to the voltage applied at the gates of FETs 106 and 108 such that large voltage swings applied in the RF signal received at node 102 cannot push either FET 106 or 108 out of pinch-off node, creating a short in path 100. Without DC restoring circuit 120, a greater number of FETs would otherwise be required to divide the voltage swing resulting from the RF signal applied at node 102. In contrast, DC restoring circuit 120 applies a downward DC offset to both FETs 106 and 108, such that the resulting swing on the gate voltages does not exceed the pinch-off voltage for FETs 106 and 108, which in one example is −1 volt.

In this example, DC restoring circuit 120 includes a resistor 122, a diode 124, and a capacitor 126. Resistor 122 has a first end coupled to capacitor 126 and a second end coupled to node 110. Diode 124 has a first end coupled to capacitor 126 and a second end coupled to node 110. Capacitor 126 is also coupled to the source of FET 106 and the drain of FET 108. Resistor 122 provides a leakage path to allow a control voltage applied at 110 to reach the gates of FETs 106 and 108. Thus, resistor 122 should be sized as large as possible. Diode 124 is sized based upon the power level of operation. Resistor 122 and capacitor 126 are selected to have an RC time constant associated with a frequency that is lower than the frequency of operation, or the frequency of the received/transmitted RF signal. However, capacitor 126 should be generally small so that there is not a short circuit created. Operation of a portion of the switch is described in greater detail in connection with FIGS. 3A and 3B.

Figure 3A:
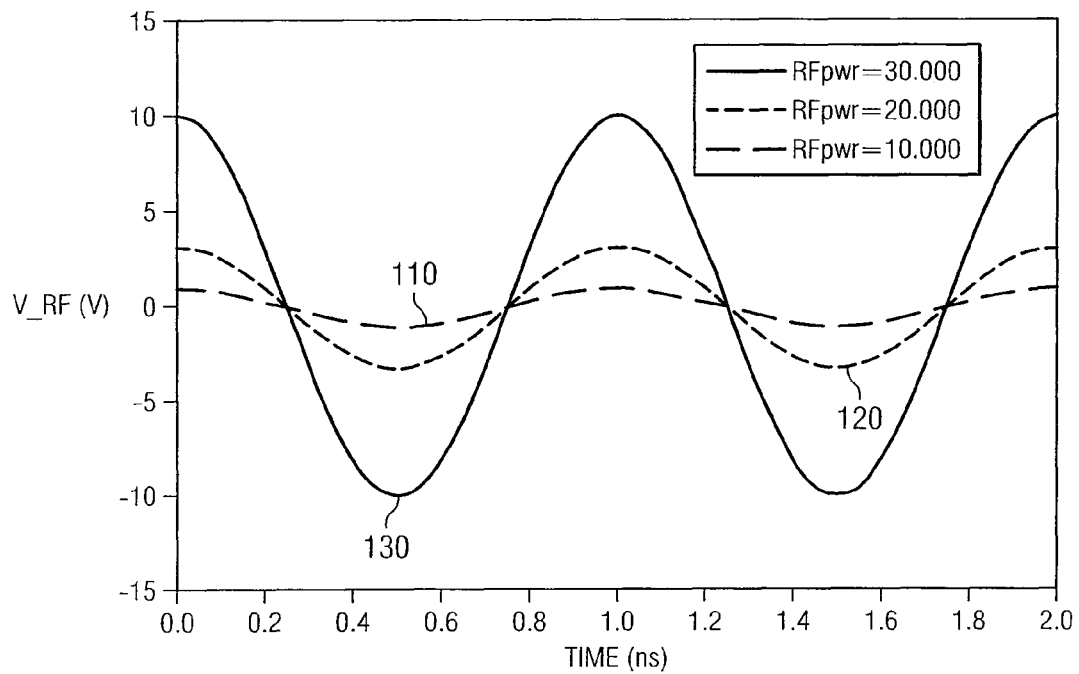
FIGS. 3A and 3B are graphs illustrating a performance of a portion of the switch illustrated in FIG. 2.
Figure 3B:
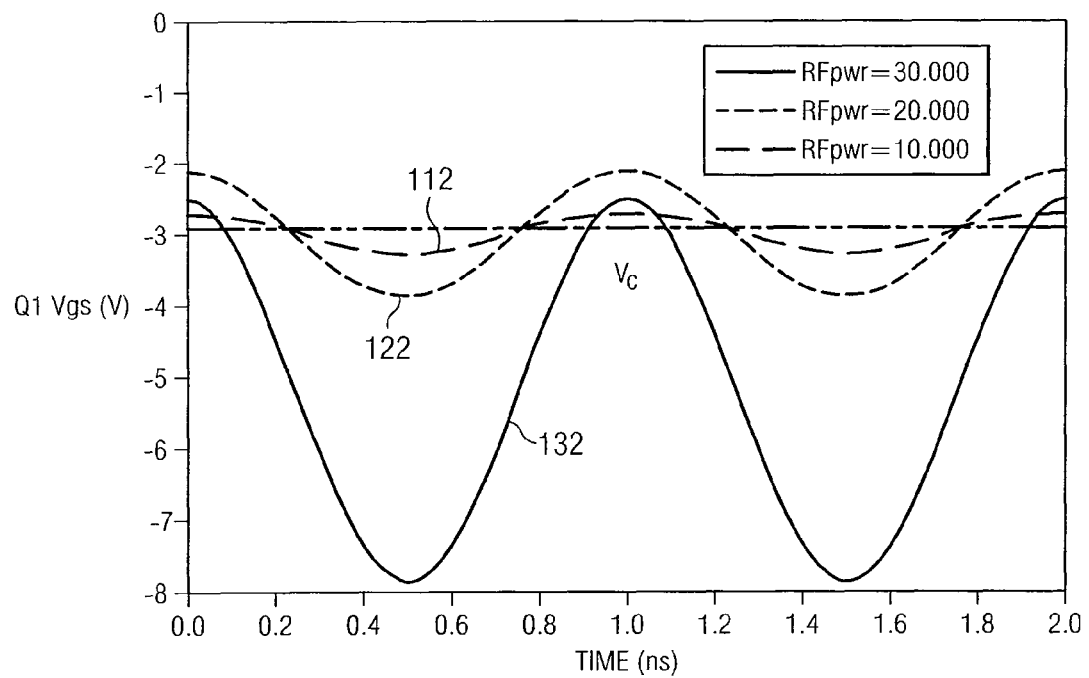

FIG. 3A is a graph illustrating a reference voltage applied at node 102, and FIG. 3B is a graph illustrating the voltage at the gate of either FET 106 or 108. Each graph shows a plurality of different inputs and outputs based upon differing power levels. In FIG. 3A, curve 110 is the input voltage associated with a power level of 0.01 watts; curve 120 is the input voltage associated with the power level of 0.1 watts; and curve 130 is the input voltage associated with the power level of 1 watt. In FIG. 3B, curve 112 is the gate voltage associated with an input power level of 0.01 watts; curve 122 is the gate voltage associated with an input power level 0.1 watts; and curve 132 is the gate voltage associated with an input power level of 1 watt.

As illustrated best with respect to curves 130 and 132, when the voltage swing on node 102 is large, which would otherwise bring FETs 106 and 108 out of pinch-off mode, DC restoring circuit 120 acts to provide a DC offset downward to curve 132 such that curve 132 never exceeds the pinch-off voltage (approximately −1.0 volts in this example) thus, permitting path 100 to dissipate large amounts of power with only two FETs. Such an approach provides large absorption of RF energy in a small device with good insertion loss.

In some implementations even larger amounts of power may be dissipated by adding a second pair of FETs in series with FETs 106 and 108, with an additional DC restoring circuit such as DC restoring circuit 120.

Although the present invention and its advantages have been described in detail, it should be understood that various changes, substitutions, and alterations can be made therein without departing from the spirit and scope of the invention as defined by the appended claims.

What is claimed is:

1. A circuit for use in an alternating current signal switch comprising:
    a first field effect transistor having a gate, a source, and a drain, the drain coupled to a first reference node for receiving the alternating current signal;
    a second field effect transistor having a gate, a source, and a drain, the source of the second field effect transistor coupled to a second reference node and the drain of the second field effect transistor coupled to the source of the first field effect transistor;
    a first gate resistor coupled to the gate of the first field effect transistor;
    a second gate resistor coupled to the gate of the second field effect transistor;
    a DC restoring circuit operable to provide a DC offset to a respective voltage of the gates of the first and second field effect transistors and to maintain the first and second field effect transistors in pinch-off mode when desired, comprising:
        a resistor having a first end and a second end;
        a diode having a cathode end and an anode end, the anode end coupled to the first end of the resistor and the cathode end coupled to the second end of the resistor; and
        a capacitor having a first end coupled to the first end of the resistor and the anode end of the diode and also having a second end coupled to the source of the first field effect transistor and the drain of the second field effect transistor; and
    a third reference node operable to receive a control voltage for controlling the first and second field effect transistors, the third reference node coupled to the second end of the resistor and the cathode end of the diode.

2. The circuit of claim 1, wherein the diode has a turn-on voltage of approximately 0.7 volts.

3. The circuit of claim 1, wherein the gate resistors each have a resistance greater than 2 kiloohms.

4. The circuit of claim 1, wherein the alternating current signal has a power level greater than 1 watt.

5. A switch for switching alternating current signals comprising:
    at least two paths each comprising at least first and second field effect transistors coupled in series and operable to receive the alternating current signals; and
    in at least one of the paths:
        a DC restoring circuit operable to provide a DC offset to a respective voltage on respective gates of the first and second field effect transistors in the at least one path; and
        a control voltage node coupled to the DC restoring circuit and operable to receive a control voltage for controlling the first and second field effect transistors, wherein the DC restoring circuit comprises a resistor, a diode, and a capacitor, the resistor having a first end coupled to a first end of the capacitor and a second end coupled to the control voltage node, the diode having a cathode end coupled to the control voltage node and an anode end coupled to the first end of the capacitor, and the capacitor having a second end coupled to a source of the first transistor and a drain of the second transistor.

6. The switch of claim 5, and further comprising a first gate resistor coupled to the gate of the first transistor and a second gate resistor coupled to the gate of the second transistor.

7. The switch of claim 6, wherein the first gate resistor and the second gate resistor are each coupled to the anode end of the diode and the first end of the resistor.

8. The switch of claim 7, wherein the diode has a turn-on voltage of approximately 0.7 volts.

9. The switch of claim 8, wherein the gate resistors each have a resistance greater than 2 kiloohms.

10. The switch of claim 7, wherein the alternating current signal has a power level greater than 1 watt.

11. A method for switching an alternating current signal between at least two paths, the method comprising:
providing, in at least one of the paths, first and second field effect transistors coupled in series and each having a gate;
providing a control voltage node operable to receive a control voltage; and
maintaining each of the first and second field effect transistors in pinch-off mode by offsetting a voltage on each gate with a DC voltage component other than the control voltage when it is desired for the alternating current not to flow through the at least one path, wherein offsetting a voltage on each gate comprises providing a DC restoring circuit comprising a resistor, a diode, and a capacitor, the resistor having a first end coupled to a first end of the capacitor and a second end coupled to the control voltage node, the diode having a cathode end coupled to the control voltage node and an anode end coupled to the first end of the capacitor, and the capacitor having a second end coupled to a source of the first transistor and a drain of the second transistor.

12. The method of claim 11, wherein the alternating current has a frequency and wherein providing the DC restoring circuit comprises providing a DC restoring circuit that has an RC time constant associated with a frequency that is slower than the frequency of the alternating current.

13. The method of claim 11, wherein the alternating current signal has a power level greater than 1 watt.

14. The method of claim 11, wherein the diode has a turn-on voltage of approximately 0.7 volts.

15. The method of claim 11, wherein the alternating current signal is a microwave signal.

\* \* \* \* \*